United States Patent
Bang

(10) Patent No.: US 7,968,994 B2
(45) Date of Patent: Jun. 28, 2011

(54) MEMORY MODULES AND SYSTEMS INCLUDING THE SAME

(75) Inventor: Hyo-Jae Bang, Cheonan-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 74 days.

(21) Appl. No.: 12/368,400

(22) Filed: Feb. 10, 2009

(65) Prior Publication Data

US 2009/0200653 A1    Aug. 13, 2009

(30) Foreign Application Priority Data

Feb. 12, 2008   (KR) ........................ 10-2008-0012635

(51) Int. Cl.
 *H01L 23/02*   (2006.01)
(52) U.S. Cl. ......... 257/686; 257/685; 257/730; 257/777
(58) Field of Classification Search .................. 257/686, 257/685, 730, 777
See application file for complete search history.

(56) References Cited

U.S. PATENT DOCUMENTS

| 6,737,738 B2 * | 5/2004 | Koh et al. ..................... 257/686 |
| 2006/0102997 A1 | 5/2006 | Bang et al. |

FOREIGN PATENT DOCUMENTS

| JP | 2006148105 | 6/2006 |
| KR | 1020060053834 | 5/2006 |
| KR | 100712540 | 4/2007 |
| KR | 1020070081009 | 8/2007 |

* cited by examiner

*Primary Examiner* — Long Pham
(74) *Attorney, Agent, or Firm* — F. Chau & Associates, LLC

(57) ABSTRACT

Provided is a memory module. The memory module may include a mounting substrate including a plurality of first substrate pads disposed on a top surface of the mounting substrate, a first semiconductor package disposed on a top surface of the mounting substrate, the first semiconductor package having a first frame and first external connection terminals which extend through the outside of the first frame and are disposed on the first substrate pads, a first connection member including first connection terminals disposed between the first external connection terminals and the first substrate pads and a pressure fixing member compressing the first connection member to electrically connect the first external connection terminals and the first substrate pads by the medium of the first connection terminals.

14 Claims, 12 Drawing Sheets

MEMORY MODULES AND SYSTEMS INCLUDING THE SAME

CROSS-REFERENCE TO RELATED APPLICATIONS

This U.S. non-provisional patent application claims priority under 35 U.S.C. §119 of Korean Patent Application No. 2008-0012635, filed on Feb. 12, 2008, the disclosure of which is hereby incorporated by reference in its entirety.

BACKGROUND

Exemplary embodiments disclosed herein relate to memory modules, and more particularly, to memory modules and systems including the same.

As electronic devices have become small and light, a high density and a high mounting of a package which is the core of electronic devices have become an important consideration. As a computer needs memory devices of a high capacity, a size of a semiconductor device such as a random access memory (RAM) device and a flash memory device naturally increases while a size of a package is required to be small.

A lot of methods have been introduced to reduce a package size of a semiconductor. For example, a stack type semiconductor package in which a plurality of semiconductor packages is stacked and a memory module that a plurality of semiconductor packages and/or a stack type semiconductor package are mounted on a printed circuit board (PCB) have been introduced.

In a memory module, a semiconductor package may include a semiconductor package of a lead frame type. A semiconductor package of a lead frame type includes an external connection terminal (e.g., a lead) which is extended outside of a frame. A printed circuit board including a circuit interconnection includes a substrate pad which is electrically connected to the circuit interconnection. A solder adhesion may be used to electrically connect a substrate pad and an external interconnection of a semiconductor package.

SUMMARY

Exemplary embodiments provide a memory module. The memory module may include a mounting substrate including a plurality of first substrate pads disposed on a top surface of the mounting substrate; a first semiconductor package disposed on the top surface of the mounting substrate, the first semiconductor package having a first frame and first external connection terminals which extend through the outside of the first frame and are disposed on the first substrate pads; a first connection member including first connection terminals disposed between the first external connection terminals and the first substrate pads; and a pressure fixing member compressing the first connection member to electrically connect the first external connection terminals and the first substrate pads by the medium of the first connection terminals.

According to an embodiment of the present invention, the memory module may comprise a second semiconductor package disposed on the first semiconductor package, the second semiconductor package including a second frame and a plurality of second external connection terminals which extends through the outside of the second frame and a second connection member including a plurality of second connection terminals disposed between the first external connection terminals and the second external connection terminals.

According to an embodiment of the present invention, the memory module may further comprise: a plurality of second substrate pads provided on a bottom surface of the mounting substrate, a second semiconductor package disposed on a bottom surface of the mounting substrate, the second semiconductor package having a second frame and a plurality of second external connection terminals which extends through the outside of the second frame and is disposed on the second substrate pads, and a second connection member including a plurality of second connection terminals disposed between the second external connection terminals and the second substrate pads. According to ano embodiment of the present invention, there is provided a memory system that comprises a host and a memory module comprising a storage medium for storing data and a controller configured to control the storage medium and communicate with the host, wherein the memory module further comprising: a mounting substrate including a plurality of first substrate pads disposed on a top surface of the mounting substrate, a first semiconductor package disposed on the top surface of the mounting substrate, wherein the first semiconductor package having a first frame and a plurality of first external connection terminals which extends through the outside of the first frame and is disposed on the first substrate pads, a first connection member including a plurality of first connection terminals disposed between the first external connection terminals and the first substrate pads and a pressure fixing member compressing the first connection member to electrically connect the first external connection terminals and the first substrate pads by a medium of the first connection terminals.

BRIEF DESCRIPTION OF THE FIGURES

The accompanying figures are included to provide a further understanding of embodiments of the present invention, and are incorporated in and constitute a part of this specification. Exemplary embodiments of the present invention will become readily apparently by reference to the following detailed description, when considered with the accompany drawings wherein.

DETAILED DESCRIPTION OF EMBODIMENTS

Figure 1:
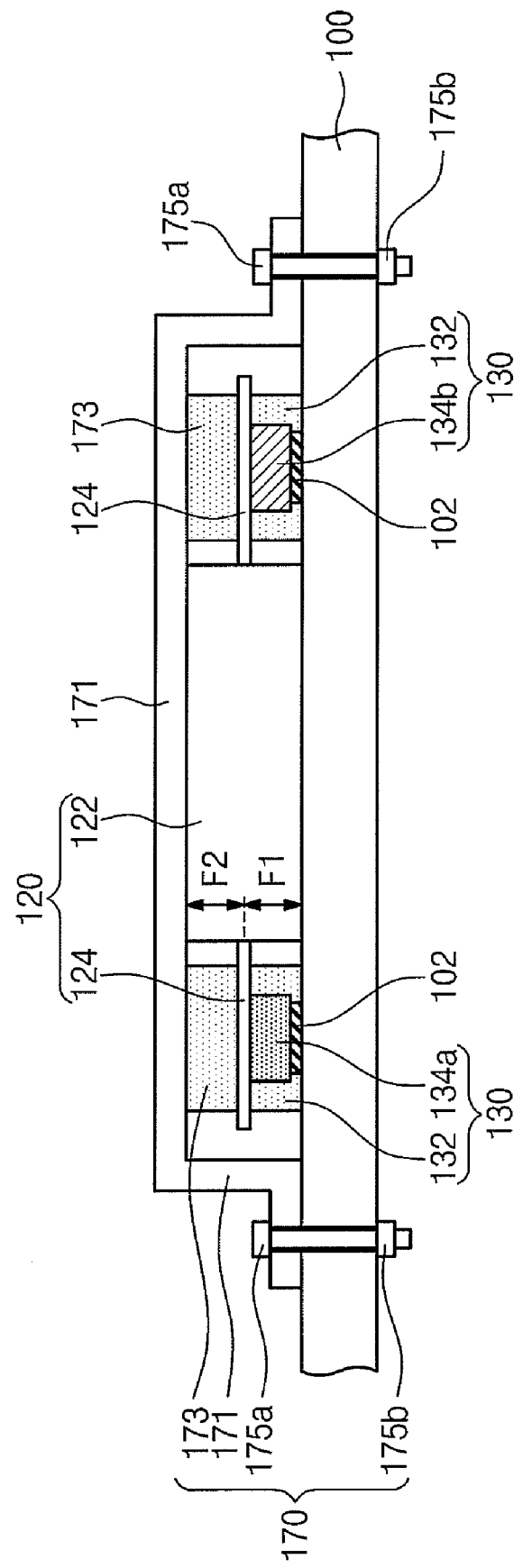
FIG. 1 is a cross-sectional view of a memory module according to an embodiment of the present invention.

Embodiments of the present invention now will be described more fully hereinafter with reference to the accompanying drawings. This invention may, however, be embodied in many different forms and should not be construed as limited to the embodiments set forth herein. In the drawings, the size and relative sizes of layers and regions may be exaggerated for clarity. The same reference numerals may refer to same or similar elements throughout.

Referring to FIGS. 1 through 6, a memory module according to a first embodiment of the present invention will be described.

FIG. 1 is a cross-sectional view of a memory module according to an embodiment of the present invention. Referring to FIG. 1, a memory module according to a first embodiment of the present invention may include a mounting substrate 100 including substrate pads 102, a semiconductor package 120 including a frame 122 on the mounting substrate 100 and external connection terminals 124, a connection member 130 including a connection body 132 and connection terminals 134a, 134b disposed between the substrate pads 102 and the external connection terminals 124, and a pressure fixing member 170 including a cover 171 and a joint member 175a, 175b. The pressure fixing member 170 may further include a pressure auxiliary member 173 disposed between the cover 171 and the external connection terminals 124.

Figure 2:
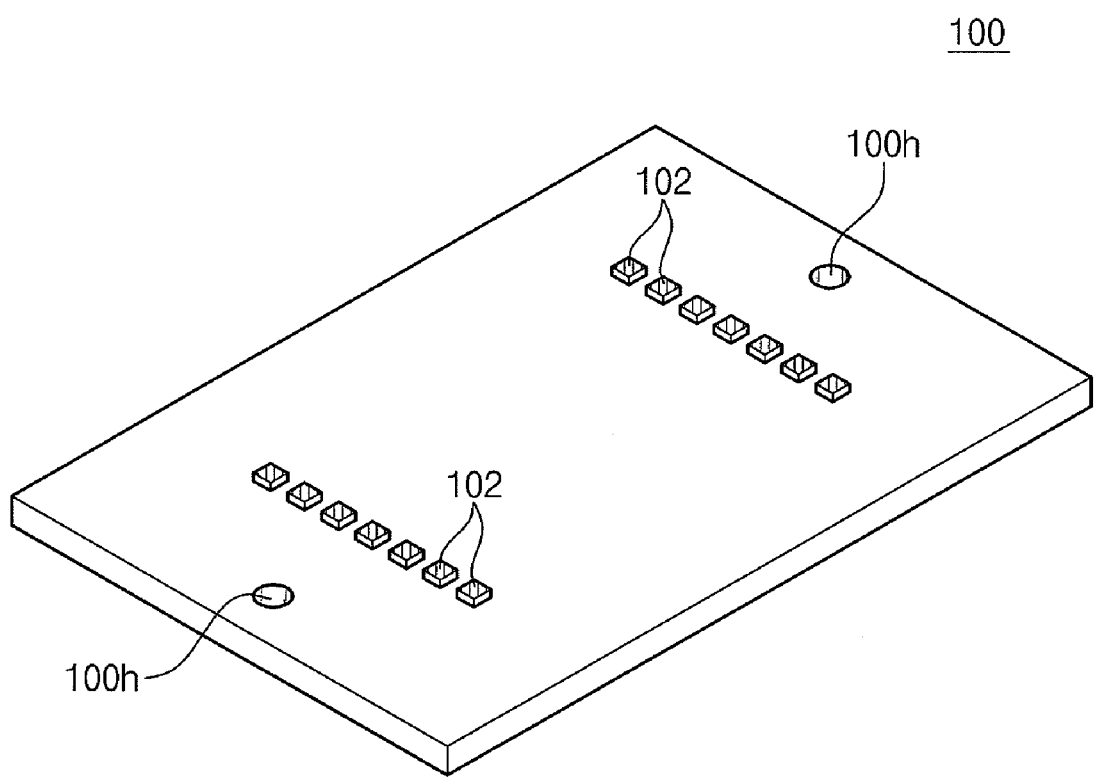
FIG. 2 is a perspective view of a mounting substrate of a memory module according to an embodiment of the present invention.

FIG. 2 is a perspective view of a mounting substrate of a memory module according to an embodiment of the present invention. Referring to FIGS. 1 and 2, the mounting substrate 100 may be a printed circuit board (PCB) including a circuit interconnection (not shown). The mounting substrate 100 may include substrate pads 102 which are electrically connected to the circuit interconnection. A plurality of the substrate pads may be disposed on a top surface of the mounting substrate 100 in a protrusion shape. The mounting substrate 100 may include a penetration hole 100h penetrating the mounting substrate 100.

Figure 3:
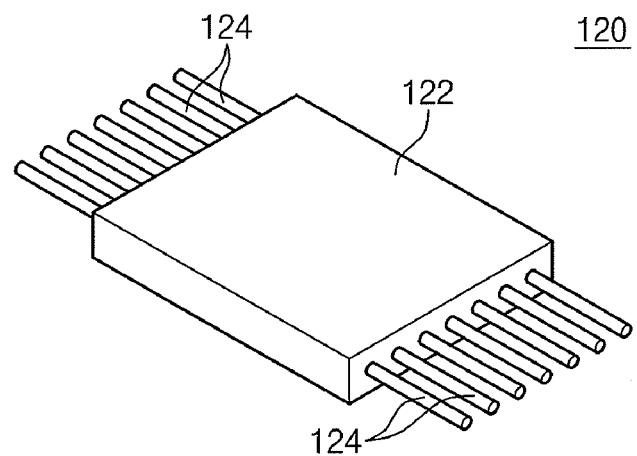
FIG. 3 is a perspective view of a semiconductor package of a memory module according to an embodiment of the present invention.

FIG. 3 is a perspective view of a semiconductor package of a memory module according to an embodiment of the present invention. Referring to FIGS. 1 and 3, the semiconductor package 120 includes the frame 122 and the external connection terminals 124 extending through the outside of the frame 122. The external connection terminals 124 may be fixed to the frame 122. The external connection terminals 124 may have a bar shape and may be disposed on the substrate pads 102 plurally corresponding to the substrate pads 102. The frame 122 may include semiconductor chips (not shown), bonding wires (not shown) and a molding part (not shown). The external connection terminals 124 may be electrically connected to the semiconductor chips by the bonding wires. The semiconductor package 120 may include a package of a lead frame type. The semiconductor package 120 may be a semiconductor device package of a thin small outline package type.

Figure 4:
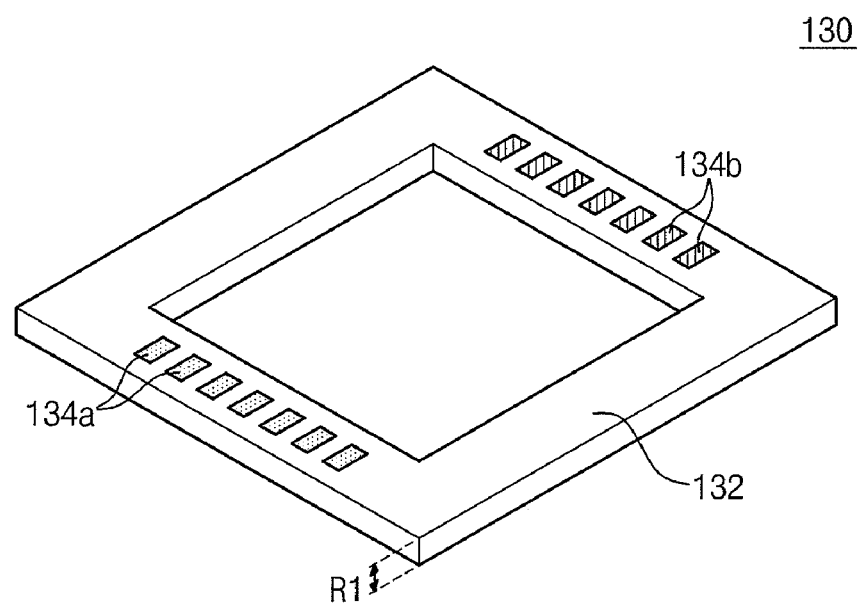
FIG. 4 is a perspective view of a connection member of a memory module according to an embodiment of the present invention.

FIG. 4 is a perspective view of a connection member of a memory module according to an embodiment of the present invention. Referring to FIGS. 1 and 4, the connection member 130 may include the conductive connection terminals 134a, 134b and the connection body 132 which may include the conductive connection terminals 134a, 134b and has flexibility. The connection body 132 may surround sides of the frame 122 disposed below the external connection terminals 124.

The connection body 132 may have a predetermined thickness (R1) greater than a distance (F1) between the external connection terminals 124 and a bottom surface of the frame 122. The connection body 132 may be an insulating rubber plate. For example, the connection body 132 may be formed by solidifying silicon powder.

The connection terminals 134a, 134b may be exposed to both surfaces of the connection body 132 or protrude from both surfaces of the connection body 132. The connection terminals 134a, 134b may be disposed between the substrate pads 102 and the external connection terminals 124. The connection terminals 134a, 134b corresponding to the substrate pads 102 may be disposed plurally. The connection terminals 134a, 134b may be formed of solidified conductive powder and/or conductive lines. The solidified conductive powder may include a nickel coated with gold. The conductive lines may be metal conductive lines.

Figure 5:
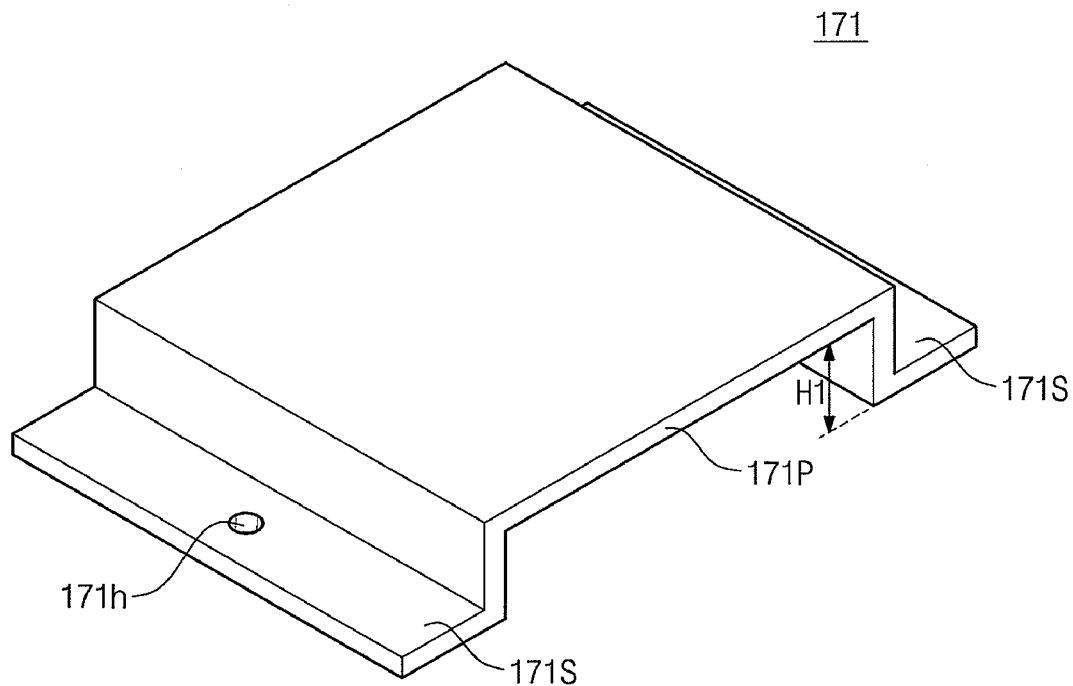
FIG. 5 is a perspective view of a cover of a memory module according to an embodiment of the present invention.

FIG. 5 is a perspective view of a cover of a memory module according to an embodiment of the present invention. Referring to FIGS. 1, 2 and 5, the cover 171 may be disposed on a semiconductor package 120, the cover 171 being in contact with a top surface of the frame 122. The cover 171 may be a heat sink including a pocket 171P into which the semiconductor package 120 can be inserted. The pocket 171P may include an edge portion 171S of a visor shape, the edge portion 171S extending from the pocket 171P and being lower than the pocket 171P. The edge portion 171S of the pocket 171P includes a penetration hole 171h and can adhere closely to the mounting substrate 100. A depth (H1) between the pocket 171P and the edge portion 171S may be equal to a thickness (F1+F2) of the frame 122 of the semiconductor package 120. A joint member 175a, 175b may join the cover 171 to the mounting substrate 100. For example, the joint member 175a may penetrate the penetration hole 171h and the penetration hole 100h. And then, the cover 171 and the mounting substrate 100 may be pressed by the joint member 175b. Due to joining the cover 171 to the mounting substrate 100, the first semiconductor package 120 on the mounting substrate 100 may be pressed and the first connection member 130 may be compressed. Consequently, the connection body 132 may be compressed to electrically the connect substrate pads 102 and the external connection terminals 124 by the medium of connection terminals 134a, 134b.

Additionally, since the joint member 175a, 175b are fixedly joined with the cover 171 and the mounting substrate 100, the electrical connection can be stably maintained. The joint member 175a, 175b may include a bolt and a nut. The pressure fixing member 170 may be comprised of the cover 171 and the joint member 175a, 175b.

Figure 6:
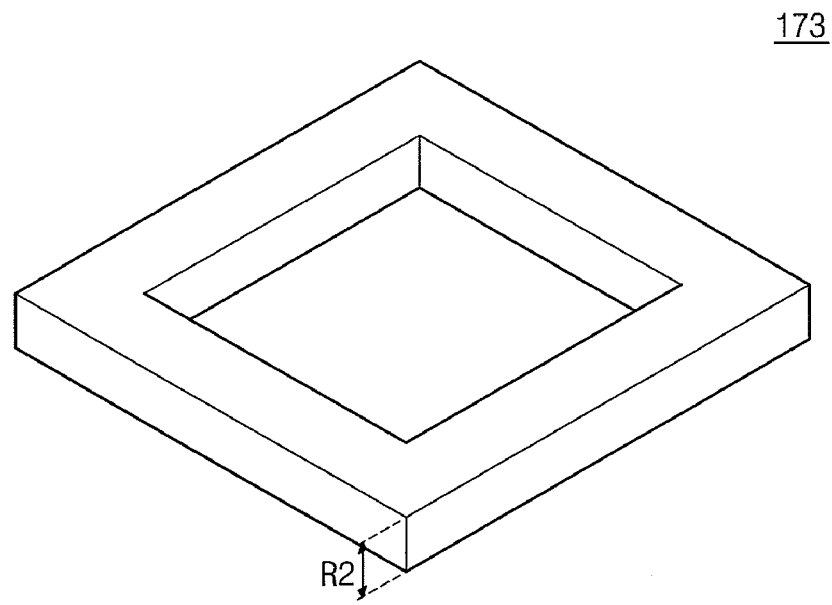
FIG. 6 is a perspective view of a pressure auxiliary member of a memory module according to an embodiment of the present invention.

FIG. 6 is a perspective view of a pressure auxiliary member of a memory module according to an embodiment of the present invention. Referring to FIGS. 1 and 6, the pressure fixing member 170 may further include the pressure auxiliary member 173. The pressure auxiliary member 173 may be further disposed between the cover 171 and the external connection terminals 124. The pressure auxiliary member 173 may surround sides of the frame 122 above the external connection terminals 124. The pressure auxiliary member 173 may be a rubber plate. The pressure auxiliary member 173 may have a predetermined thickness (R2) greater than a distance (F2) between the external connection terminals 124 and the top surface of the frame 122. The pressure auxiliary member 173 presses the connection body 132 to help an electrical connection of the external connection terminals 124 and the substrate pads 102 and to stably maintain the electrical connection.

According to an embodiment of the present invention, a solder adhesion for electrical connection of the substrate pads 102 of the mounting substrate 100 and the extending external connection terminals 124 is not necessary. Thus, problems of the solder adhesion (e.g., a crack or a falling off of a solder adhesion may occur due to a difference of the coefficient of thermal expansion) do not occur. A reliability of a memory module can be improved as compared with using solder adhesion as the electrical medium.

Moreover, it is not necessary to plate the external connection terminals 124 for easy solder adhesion. Since the connection member 130 including the connecting body 132 and the conductive connection terminals 134a, 134b formed of a relatively low-priced rubber plate is used instead of the solder adhesion to electrically connect the substrate pads 102 and the external connection terminals 124, the cost of production of the memory module can be reduced.

Referring to FIGS. 7 through 14, a memory module according to an embodiment of the present invention is described.

Figure 7:
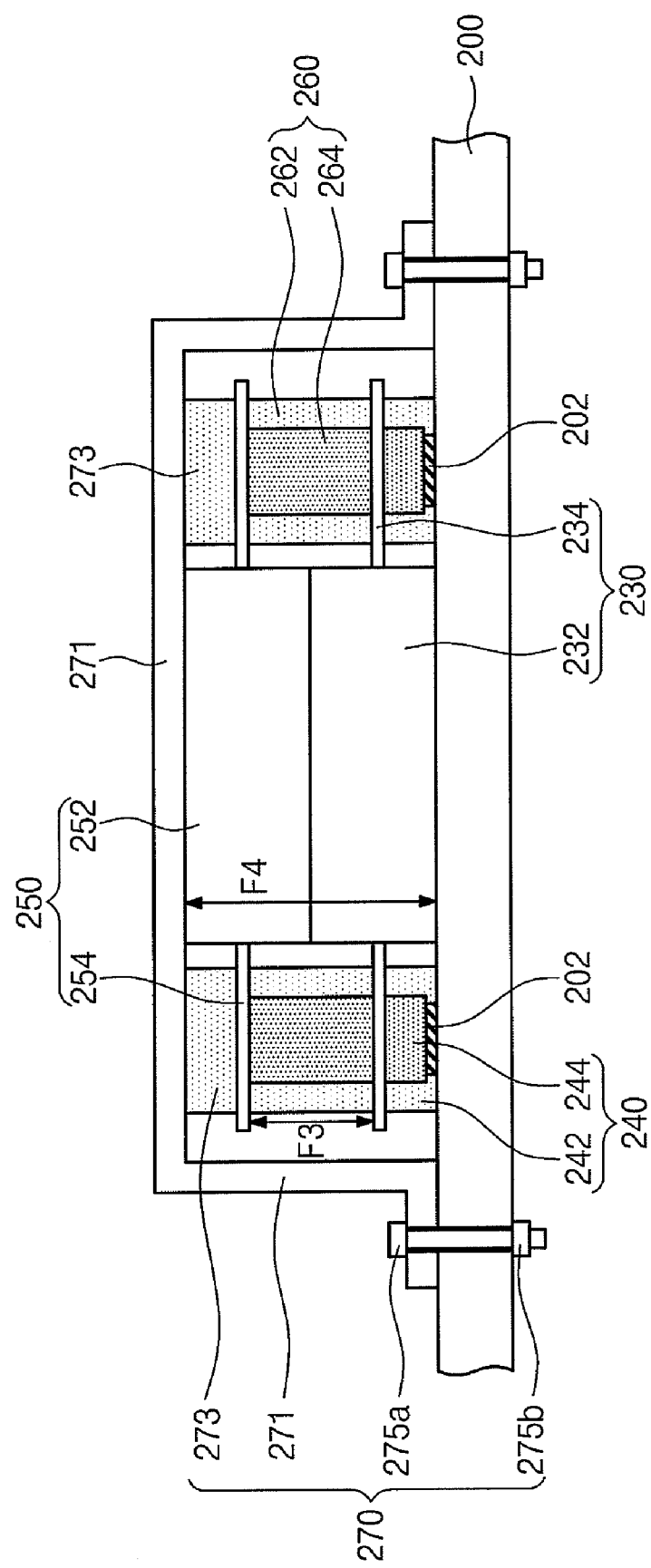
FIG. 7 is a cross-sectional view of a memory module according to an embodiment of the present invention.

FIG. 7 is a cross-sectional view of a memory module according to an embodiment of the present invention. Referring to FIG. 7, a memory module may include a mounting substrate 200 including substrate pads 202, a first semiconductor package 230 including first external connection terminals 234 and a first frame 232 on the mounting substrate 200, a first connection member 240 including first connection terminals 244 and first connection bodies 242, a second semiconductor package 250 including second external connection terminals 254 and a second frame 252 on the first semiconductor package 230, a second connection member 260 including first connection terminals 264 and second connection bodies 262 disposed between the first external connection terminals 234 and the second external connection terminals 254, and a pressure fixing member 270 including a cover 271 and a joint member 275a and 275b. The pressure fixing member 270 may farther include a pressure auxiliary member 273 disposed between the cover 271 and the second external connection terminals 254.

Figure 8:
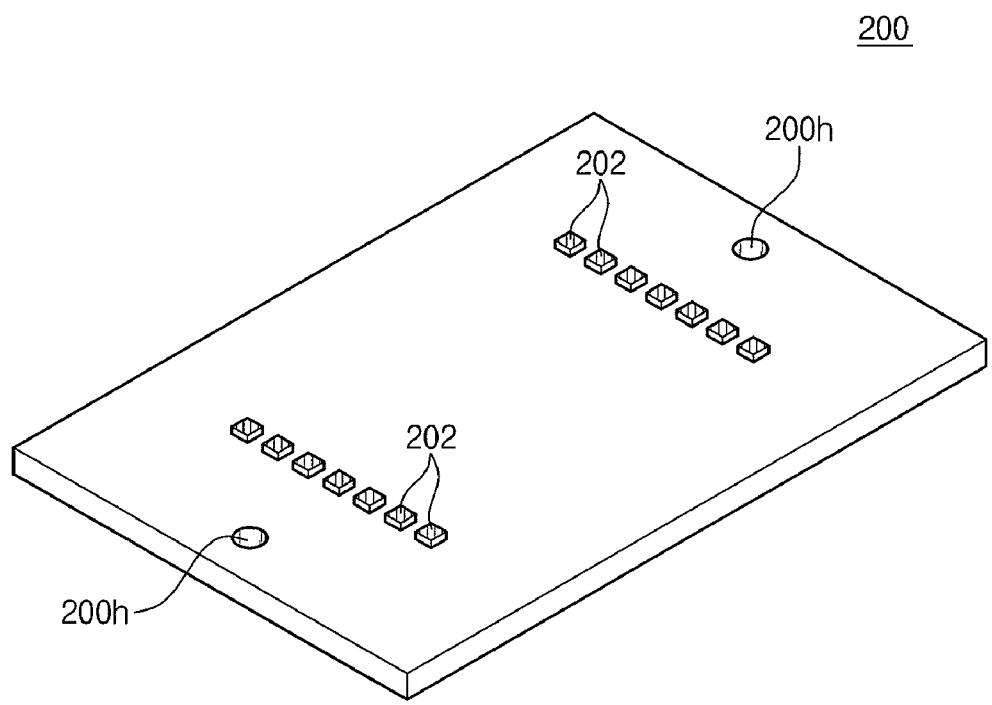
FIG. 8 is a perspective view of a mounting substrate of a memory module according to an embodiment of the present invention.

FIG. 8 is a perspective view of a mounting substrate of a memory module according to an embodiment of the present invention. Referring to FIGS. 7 and 8, the mounting substrate 200 may include the substrate pads 202. A plurality of the substrate pads 202 may be disposed on a top surface of the mounting substrate 200 in a protrusion shape. The mounting substrate 200 may include a penetration hole 200h penetrating the mounting substrate 200.

Figure 9:
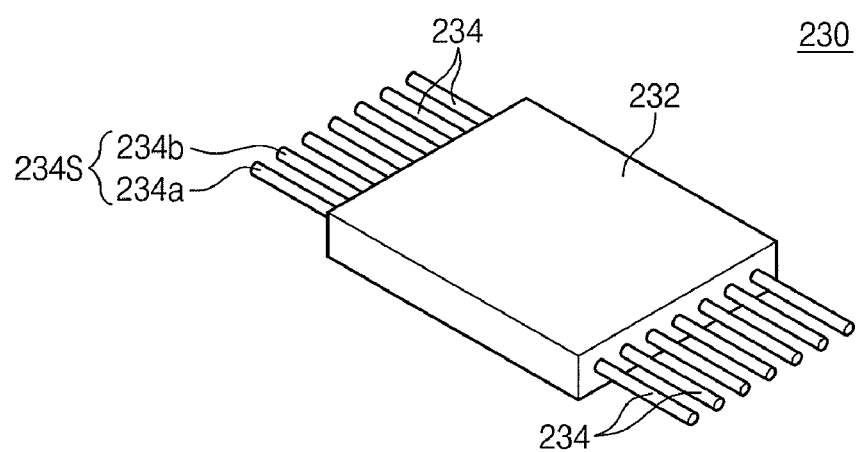
FIG. 9 is a perspective view of a first semiconductor package of a memory module according to an embodiment of the present invention.
Figure 10:
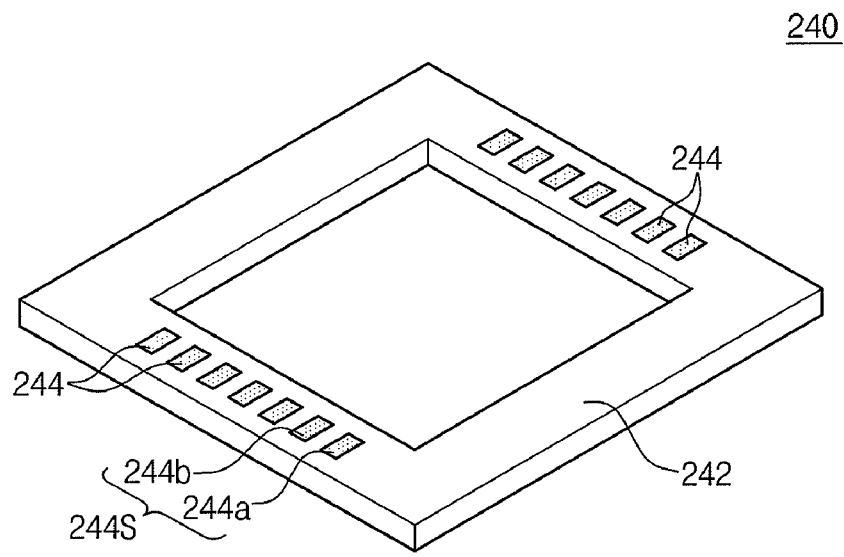
FIG. 10 is a perspective view of a first connection member of a memory module according to an embodiment of the present invention.

FIG. 9 is a perspective view of a first semiconductor package of a memory module according to an embodiment of the present invention. FIG. 10 is a perspective view of a first connection member of a memory module according to an embodiment of the present invention. Referring to FIGS. 7, 9 and 10, the first semiconductor package 230 includes the first frame 232 and the first external connection terminals 234 extending through the outside of the first frame 232. The first external connection terminals 234 may be disposed on the substrate pads 202 plurally corresponding to the substrate pads 202. The first external connection terminals 234 may include a first selective terminal portion 234S to select the first and/or second semiconductor packages 230 and 250. The selective terminal portion 234S may include a first selective terminal 234a for selecting the first semiconductor package 230 and a nonselective terminal 234b.

The first connection member 240 may include the first connection terminals 244 and the first connection body 242 including the first connection terminals 244. The first connection terminals 244 are disposed between the substrate pads 202 and the first external connection terminals 234. A plurality of connection terminals 244 corresponding to the substrate pads 202 may be disposed on the first connection body 242. The first connection terminals 244 may be formed of solidified conductive powder and/or conductive lines. The solidified conductive powder may include a nickel coated with gold. The conductive lines may be metal conductive lines. The first connection bodies 242 may be an insulating rubber plate. The first connection bodies 242 may be formed by solidifying silicon power.

The first connection member 240 may include a first selective connection terminal portion 244S under the first selective terminal portion 234S. The first selective connection terminal portion 244S may be comprised of the first selective connection terminal 244a and the nonselective connection terminal 244b.

Figure 11:
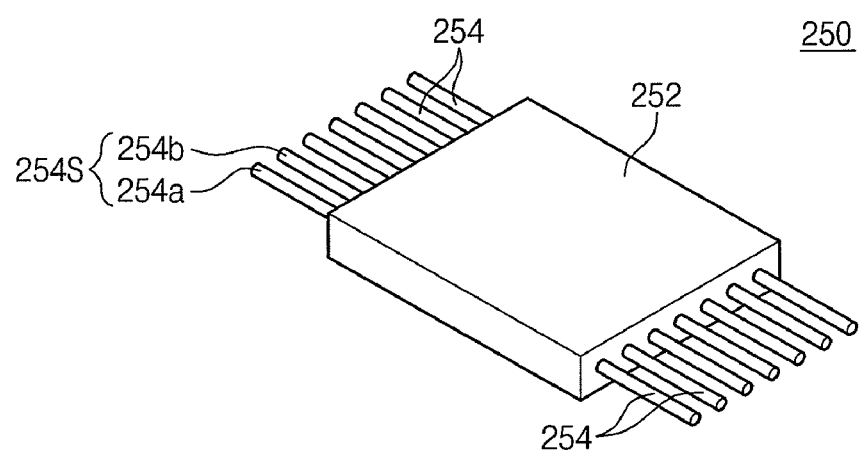
FIG. 11 is a perspective view of a second semiconductor package of a memory module according to an embodiment of the present invention.
Figure 12:
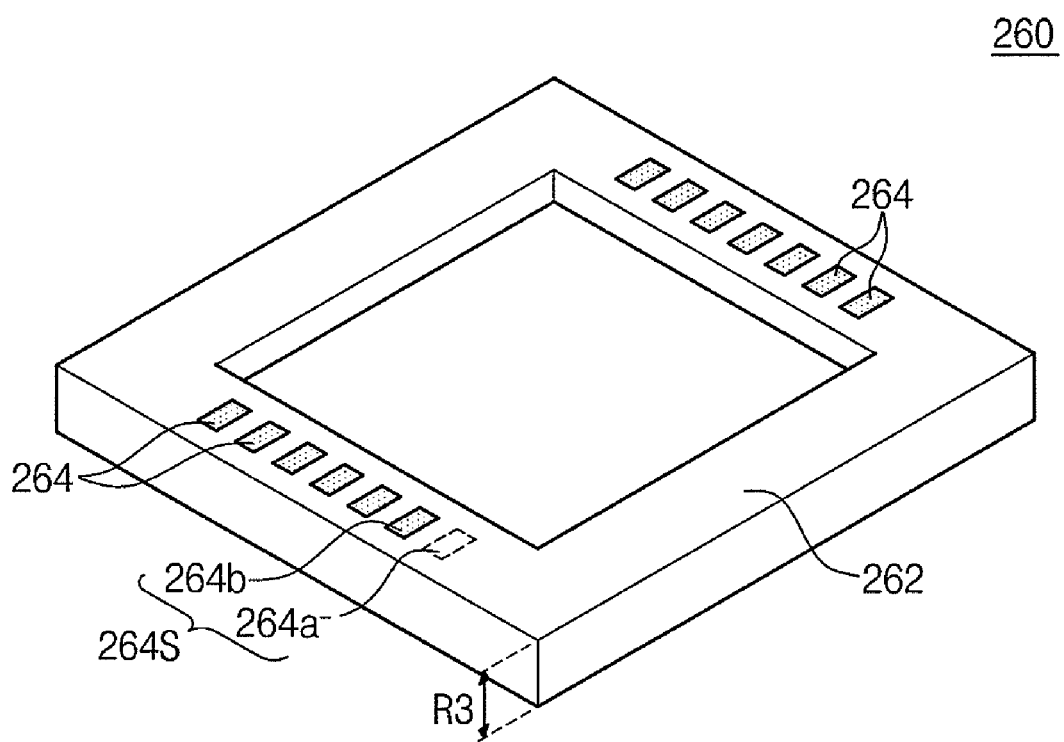
FIG. 12 is a perspective view of a second connection member of a memory module according to an embodiment of the present invention.

FIG. 11 is a perspective view of a second semiconductor package of a memory module according to an embodiment of the present invention. FIG. 12 is a perspective view of a second connection member of a memory module according to an embodiment of the present invention. Referring to FIGS. 7, 11 and 12, the second semiconductor package 250 includes the second frame 252 and the second external connection terminals 254 extending through the outside of the second frame 252. A plurality of second external connection terminals 254 may be disposed on the first external connection terminals 234 corresponding to the first external connection terminals 234 and the substrate pads 202. The second external connection terminals 254 may include the second selective terminal portion 254S to select the first and/or second semiconductor packages 230 and 250. The second selective terminal portion 254S may include a second selective terminal 254b for selecting the second semiconductor package 250 and a nonselective terminal 254a.

The second connection member 260 may include the second connection terminals 264 and the second connection body 262 including the second connection terminals 264. The second connection terminals 264 may be formed of solidified conductive powder and/or conductive lines. For example, the conductive powder may include nickel coated with gold. The conductive lines may be conductive lines of metal material. The second body 262 may be an insulating rubber plate. The second connection body 262 may be formed by solidifying silicon powder. The second body 262 may surround sides of the first frame 232 and the second frame 252 between the first and second external connection terminals 234 and 254. The second connection body 262 may have a predetermined thickness (R3) greater than a distance (F3) between the first external connection terminals 234 and the second external connection terminals 254.

The second connection member 260 may include a second selective connection terminal portion 264S under the second selective terminal portion 254S. The second selective connection terminal portion 264S may be comprised of a second selective connection terminal 264b and a nonselective connection terminal 264a. The nonselective connection terminal 264a may be an insulating region.

A lower semiconductor package and an upper semiconductor package that are sequentially stacked may be electrically connected to each other by a solder adhesion. The lower semiconductor package and the upper semiconductor package include an upper external connection terminal and a lower external connection terminal, respectively. The upper external connection terminal and the lower external connection terminal may include an upper selective terminal portion and a lower selective terminal portion, respectively. A process of forming the upper external connection terminal may be complicated to dispose the upper and lower selective terminal portions. For instance, for pin jumping, the upper external connection terminal may be formed to have a shape different from the lower external connection terminal. A correction process (e.g., a cutting process) of a portion of the upper external connection terminal which corresponds to the upper selective terminal portion may be needed.

According to an embodiment, a shape of the second external connection terminals 254 may be equal to a shape of the first external connection terminals 234. Since the second connection member 260 includes the second selective connection terminal portion 264S, the second selective terminal 254S can be disposed without performing a correction process of the second external connection terminals 254. Thus, since the second external connection terminals 254 can be easily provided, the production cost of the memory module can be reduced.

Figure 13:
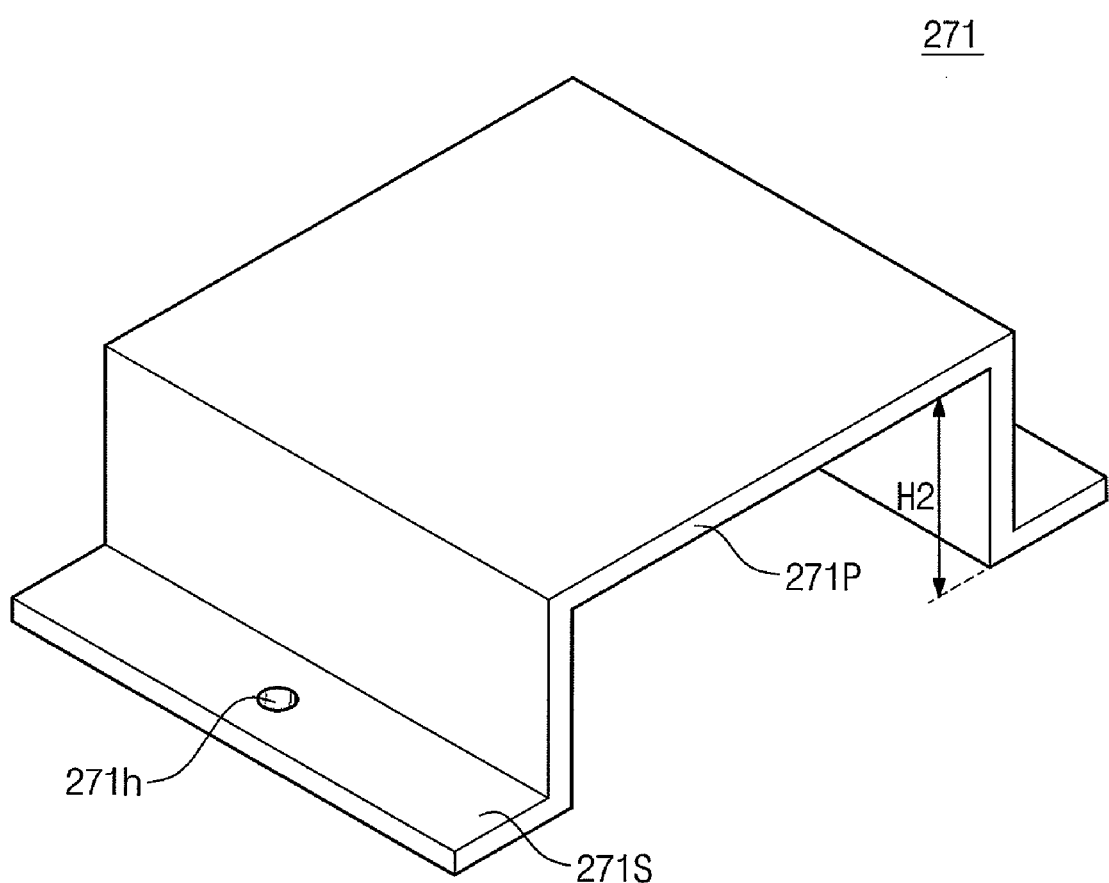
FIG. 13 is a perspective view of a cover of a memory module according to an embodiment of the present invention.

FIG. 13 is a perspective view of a cover of a memory module according to an embodiment of the present invention. Referring to FIGS. 7 and 13, a cover 271 may be disposed on the second frame 252, the cover 271 being in contact with a top surface of the second frame 252. The cover 271 may be a heat sink including a pocket 271P into which the first and second semiconductor packages 250 and 230 can be inserted. The pocket 271P may include an edge portion 271S of a visor shape, the edge portion 271S extending from the pocket 271P. The edge portion 271S of the pocket 271P includes a penetration hole 271h and can adhere closely to a mounting substrate 200. A depth (H2) between the pocket 271P and the edge portion 271S may be equal to a thickness (F4) of the first and second frame 232 and 252.

A joint member 275a and 275b may join the cover 271 to the mounting substrate 200. The joint member 275a may penetrate the penetration hole 271h and the penetration hole 200h. And then, the cover 271 and the mounting substrate 200 may be pressed by the joint member 275b. The joint member 275a and 275b can press the first and second semiconductor packages 230 and 250 on the mounting substrate 200. Consequently, the first and second connection bodies 242 and 262 are compressed to electrically connect the substrate pads 202 and the first and second external connection terminals 234 and 254 by the medium of the first and second connection terminals 244 and 264.

Additionally, since the joint member 275a and 275b is fixedly joined with the cover 271 and the mounting substrate 200, the electrical connection can be stably maintained. The joint member 275a and 275b may include a bolt and a nut. A pressure fixing member 270 may be comprised of the cover 271 and the joint member 275a and 275b.

Figure 14:
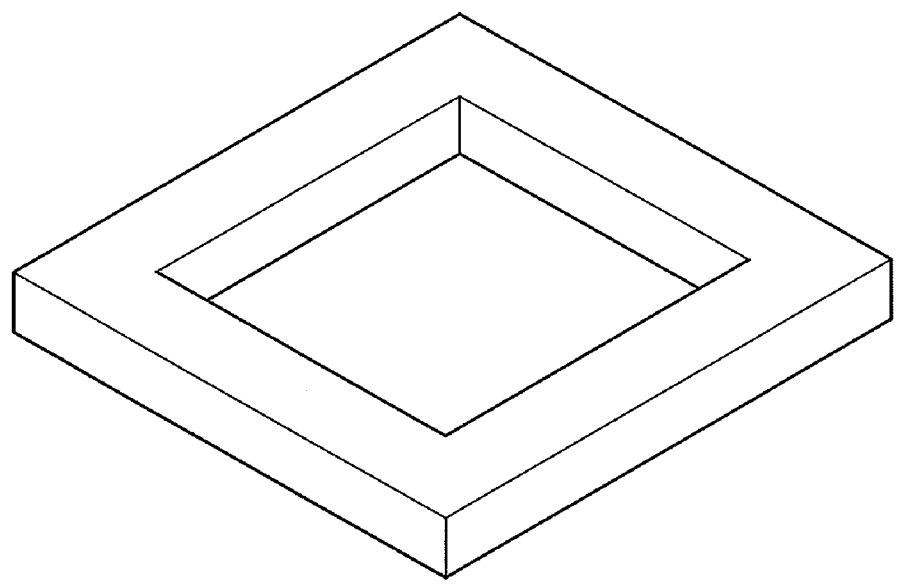
FIG. 14 is a perspective view of a pressure auxiliary member of a memory module according to an embodiment of the present invention.

FIG. 14 is a perspective view of a pressure auxiliary member of a memory module according to an embodiment of the present invention. Referring to FIG. 14, the pressure fixing member 270 may further include the pressure auxiliary member 273. That is, the pressure auxiliary member 273 may be disposed between the cover 271 and the second external connection terminals 254 on the second connection member 260. The pressure auxiliary member 273 presses the first and second connection body 242 and 262 to help an electrical connection of the first and second external connection terminals 234 and 254 and the substrate pads 202 and to stably maintain the electrical connection.

Figure 15:
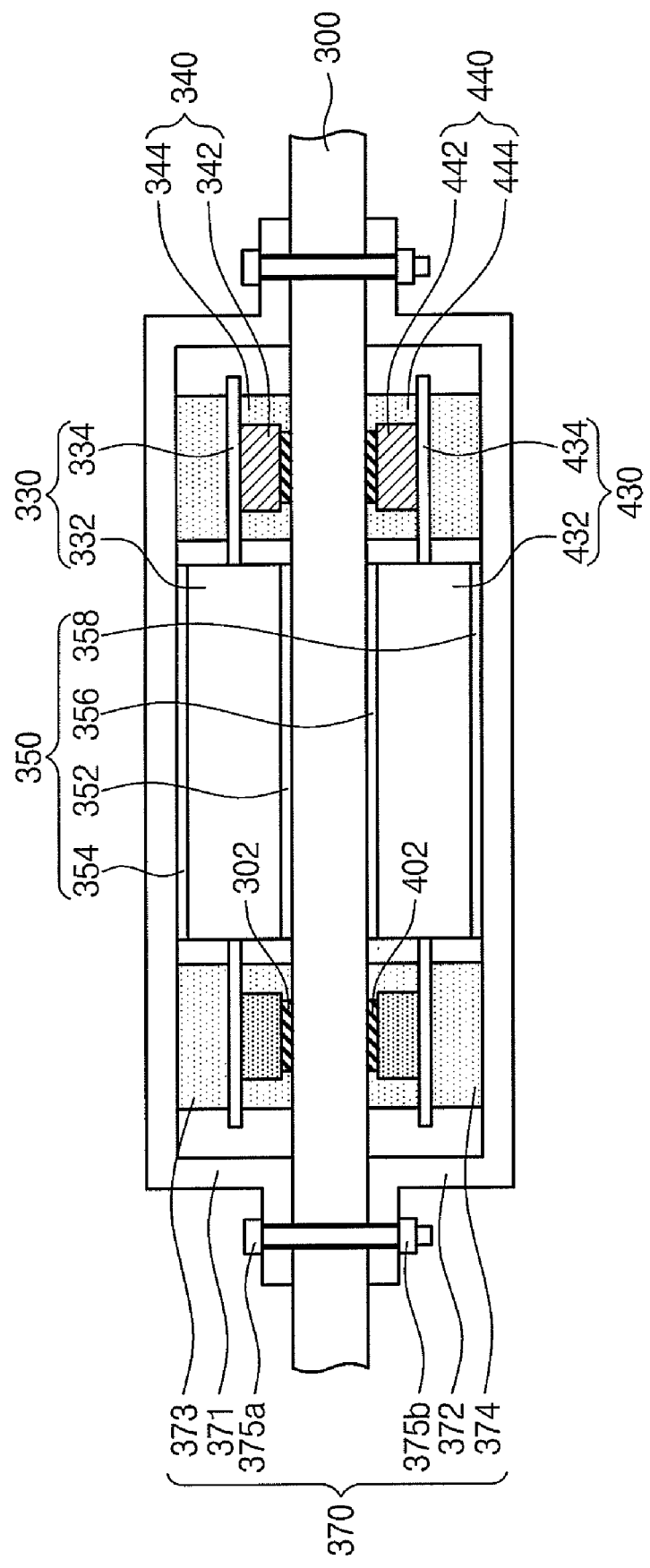
FIG. 15 is a cross-sectional view of a memory module according to an embodiment of the present invention.

FIG. 15 is a cross-sectional view of a memory module according to an embodiment of the present invention.

Referring to FIG. 15, a memory module according to an embodiment may include a mounting substrate 300 including first substrate pads 302 disposed on a top surface of the mounting substrate 300 and second substrate pads 402 disposed on a bottom surface of the mounting substrate 300, a first semiconductor package 330 disposed on a top surface of the mounting substrate 300 and a second semiconductor package 430 disposed on a bottom surface of the mounting substrate 300.

The first semiconductor package 330 includes a first frame 332 and first external connection terminals 334 and the second semiconductor package 430 includes a second frame 356 and second external connection terminals 434. The first and second external connection terminals 334 and 434 may include selective terminal portions (not shown), respectively.

A first connection member 340 may be disposed between the first substrate pads 302 and the first external connection terminals 334. The first connection member 340 may include first connection terminals 342 and a first connection body 344. The first connection terminals 342 may be formed from an insulating rubber plate. The first connection body 344 may be formed by solidifying silicon powder. A conductive powder may include nickel coated with gold. Conductive lines may be metal conductive lines. A second connection member 440 may be disposed between the second substrate pads 402 and the second external connection terminal 434. The second connection member 440 may include second connection terminals 442 and a second connection body 444. The second connection terminals 442 may be formed from solidified conductive powder and/or conductive lines. The second connection body 444 may be an insulating rubber plate. The second connection body 444 may be formed by solidifying silicon powder. A conductive powder may include nickel coated with gold. Conductive lines may be metal conductive lines.

A first cover 371 may be disposed on the first semiconductor package 330 and a second cover 372 may be disposed on the second semiconductor package 430. The first cover 371 may be a first heat sink which includes a first pocket. The second cover 372 may be a second heat sink which includes a second pocket. The first pocket may include an edge portion of a first visor shape, the edge portion extending from the first pocket. An edge portion of the first pocket may adhere closely to a top surface of the mounting substrate 300. The second pocket may include an edge portion of a second visor shape, the edge portion extending from the second pocket. An edge portion of the second pocket may adhere closely to a bottom surface of the mounting substrate 300. A joint member 375a and 375b may join the first semiconductor package 330 and the second semiconductor package 430 on a bottom surface of the mounting substrate 300 to the mounting substrate 300. The joint member 375a may penetrate the edge portion of the first visor shape, the mounting substrate 300 and the edge portion of the second visor shape. And then, the first semiconductor package 330, the mounting substrate 300 and the second semiconductor package 430 on a bottom surface of the mounting substrate 300 may be pressed by the joint member 375b. The joint member 375a and 375b concurrently press the first semiconductor package 330 on a top surface of the mounting substrate 300 and the second semiconductor package 430 on a bottom surface of the mounting substrate 300. As a result, the first connection body 344 is compressed to connect the first external connection terminals 334 and the first substrate pads 302 by the medium of the first connection terminals 342. And, the second connection body 444 is compressed to connect the second external connection terminals 434 and the second substrate pads 402 by the medium of the second connection terminals 442. The joint member 375*a* and 375*b* may include a bolt and a nut. A pressure fixing member 370 may comprised of the first cover 371, the second cover 372 and the joint member 375*a* and 375*b*.

The pressure fixing member 370 may further include a first auxiliary member 373 and/or a second auxiliary member 374. That is, the first auxiliary member 373 may be disposed between the first external connection terminals 334 and the first cover 371 and the second auxiliary member 374 may be disposed between the second external connection terminals 434 and the second cover 372.

The memory module according to the third embodiment may further include a thermal conductive member 350. The thermal conductive member 350 may include a first thermal conductive rubber plate 352, a second thermal conductive rubber plate 354, a third thermal conductive rubber plate 356 and a fourth thermal rubber plate 358. The first thermal conductive rubber plate 352 may be interposed between the first frame 332 and the mounting substrate 300. The second thermal conductive rubber plate 352 may be interposed between the first cover 371 and the first frame 332. The third thermal conductive rubber plate 356 may be interposed between the second frame 356 and the mounting substrate 300. The fourth thermal conductive rubber plate 358 may be interposed between the second cover 372 and the second frame 356. The thermal conductive member 350 may have an effect on a thermal emission of a memory module. The thermal conductive member 350 may be an insulating rubber plate.

The present embodiment may be applied to a memory module including a semiconductor package that is stacked on both sides of the mounting substrate. In addition, embodiments of the present invention may be applied to a memory module including semiconductor packages that are multiply stacked on both sides of the mounting substrate. Thus, a memory module of a high density and a high capacity may be formed. A thermal conductive member may be further included in embodiments of the present invention.

Figure 16:
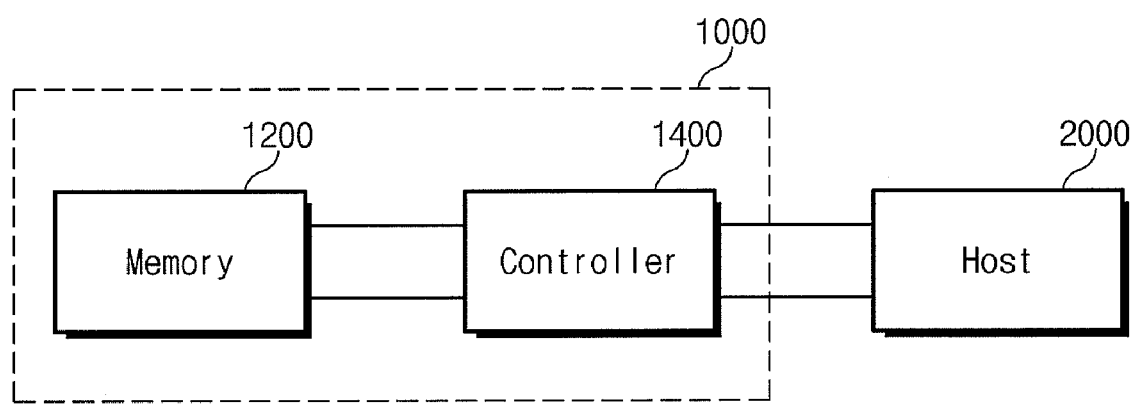
FIG. 16 is a block diagram of a system including a memory module and a host according to embodiments of the present invention.

FIG. 16 is a block diagram of a system including a memory module and a host according to embodiments of the present invention.

Referring to FIG. 16, a system may include a memory module 1000 and a host 2000. The memory module 1000 according to embodiments of the present invention may be a storage device which is a solid state disk (SSD). The memory module 1000 may be used as a memory card such as a MMC card, a SD card and a flash card. The memory module 1000 includes a storage medium 1200 and a controller 1400. The storage medium 1200 may be comprised of a plurality of flash memories (e.g., NAND flash memories). The controller 1400 may control a reading of the storage medium 1200, a program operation and an erase operation according to a request of the host 2000. The host 2000 may be, for example, a personal computer, a notebook computer and a lap top computer. The memory module 1000 and the host 2000 may be connected to each other by a standardized interface.

Although exemplary embodiments of the present invention have been described, it is understood that the present invention should not be limited to these exemplary embodiments but various changes and modifications can be made by one of ordinary skill in the art within the spirit and scope of the present invention as hereinafter claimed.

What is claimed is:

1. A memory module, comprising:
   a mounting substrate including a plurality of first substrate pads disposed on a top surface of the mounting substrate;
   a first semiconductor package disposed on the top surface of the mounting substrate, wherein the first semiconductor package includes a first frame and a plurality of first external connection terminals which extend through the outside of the first frame and are disposed on the first substrate pads;
   a first connection member including a plurality of first connection terminals disposed between the first external connection terminals and the first substrate pads; and
   a pressure fixing member compressing the first connection member to electrically connect the first external connection terminals and the first substrate pads via the first connection terminals, wherein the pressure fixing member comprises:
      a cover disposed on the first semiconductor package and a joint member joining the cover to the mounting substrate, and
      a pressure auxiliary member disposed between the cover and the first external connection terminals.

2. The memory module of claim 1, wherein the first external connection terminals are disposed to correspond to the first substrate pads.

3. The memory module of claim 1, wherein the first connection member further comprises a first connection body which includes the first connection terminals and has flexibility.

4. The memory module of claim 3, wherein the thickness of the first connection body is greater than a distance between the first external connection terminals and a bottom surface of the first frame.

5. The memory module of claim 3, wherein the first connection body is an insulator surrounding side surfaces of the first frame below the first external connection terminals.

6. The memory module of claim 5, wherein the first connection terminals are exposed to or protrude from at least one of a top surface and a bottom surface of the first connection body through the first connection body.

7. The memory module of claim 6, wherein the first connection terminals are disposed in the first connection body, the first connection terminals corresponding to the first substrate pads.

8. The memory module of claim 6, wherein the first connection terminals include solidified conductive powder or conductive lines.

9. The memory module of claim 1, wherein the first semiconductor package on the mounting substrate is pressed and the first connection member is compressed to join the cover to the mounting substrate by the joint member.

10. The memory module of claim 1, wherein the pressure auxiliary member is an insulator surrounding side surfaces of the first frame above the first external connection terminals.

11. The memory module of claim 1, further comprising:
   a plurality of second substrate pads provided on a bottom surface of the mounting substrate;
   a second semiconductor package disposed on a bottom surface of the mounting substrate, the second semiconductor package having a second frame and a plurality of second external connection terminals which extend through the outside of the second frame and are disposed on the second substrate pads; and a second connection member including a plurality of second connection terminals disposed between the second external connection terminals and the second substrate pads.

12. The memory module of claim 11, wherein the pressure fixing member further comprises a second cover on the second frame and wherein the joint member joining-joins the first cover, the mounting substrate and the second cover.

13. A memory system comprising:
a host; and
a memory module comprising a storage medium for storing data and a controller configured to control the storage medium and communicate with the host, wherein the memory module further comprises:
  a mounting substrate including a plurality of first substrate pads disposed on a top surface of the mounting substrate;
  a first semiconductor package disposed on the top surface of the mounting substrate, wherein the first semiconductor package includes a first frame and a plurality of first external connection terminals which extend through the outside of the first frame and are disposed on the first substrate pads;
  a first connection member including a plurality of first connection terminals disposed between the first external connection terminals and the first substrate pads; and
  a pressure fixing member compressing the first connection member to electrically connect the first external connection terminals and the first substrate pads via the first connection terminals, wherein the pressure fixing member comprises:
    a cover disposed on the first semiconductor package, and
    a pressure auxiliary member disposed between the cover and the first external connection terminals.

14. A memory module, comprising:
a mounting substrate including a plurality of first substrate pads disposed on a top surface of the mounting substrate;
a first semiconductor package disposed on the top surface of the mounting substrate, wherein the first semiconductor package includes a first frame and a plurality of first external connection terminals which extend through the outside of the first frame and are disposed on the first substrate pads;
a first connection member including a plurality of first connection terminals disposed between the first external connection terminals and the first substrate pads; and
a pressure fixing member compressing the first connection member to electrically connect the first external connection terminals and the first substrate pads via the first connection terminals, wherein the pressure fixing member comprises:
a cover disposed on the first semiconductor package, and
a pressure auxiliary member disposed between the cover and the first external connection terminals.

* * * * *